(12) United States Patent
Ha et al.

(10) Patent No.: US 11,056,598 B2
(45) Date of Patent: Jul. 6, 2021

(54) SOLAR CELL

(71) Applicant: LG ELECTRONICS INC., Seoul (KR)

(72) Inventors: Jungmin Ha, Seoul (KR); Youngho Choe, Seoul (KR); Changseo Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/388,491

(22) Filed: Apr. 18, 2019

(65) Prior Publication Data

US 2019/0245101 A1    Aug. 8, 2019

Related U.S. Application Data

(63) Continuation of application No. 13/614,445, filed on Sep. 13, 2012, now abandoned.

(30) Foreign Application Priority Data

Feb. 13, 2012 (KR) .......................... 10-2012-0014116

(51) Int. Cl.
*H01L 31/0224* (2006.01)
*H01L 31/0216* (2014.01)
(Continued)

(52) U.S. Cl.
CPC ............... *H01L 31/022441* (2013.01); *H01L 31/02168* (2013.01); *H01L 31/02363* (2013.01); *H01L 31/0684* (2013.01); *Y02E 10/547* (2013.01)

(58) Field of Classification Search
CPC ......... H01L 31/022441; H01L 31/0684; H01L 31/02168; H01L 31/02363
See application file for complete search history.

(56) References Cited

U.S. PATENT DOCUMENTS

2009/0007962 A1    1/2009  Wenham et al.
2009/0025786 A1    1/2009  Rohatgi et al.
(Continued)

FOREIGN PATENT DOCUMENTS

CN    101447529 A    6/2009
CN    101621084 A    1/2010
(Continued)

OTHER PUBLICATIONS

Hubner et al., "Novel cost-effective bifacial silicon solar cells with 19.4% front and 18.1% rear efficiency," Appl. Phys. Lett. vol. 70, No. 8, Feb. 24, 1997, pp. 1008-1010, XP012018380.

*Primary Examiner* — Golam Mowla
(74) *Attorney, Agent, or Firm* — Birch, Stewart, Kolasch & Birch, LLP

(57) ABSTRACT

A bifacial solar cell includes a substrate formed of a silicon wafer having an n-type conductivity; an emitter region positioned on a front surface of the substrate and having a p-type conductivity; a front negative fixed charge layer on the emitter region, and a front positive fixed charge layer on the front negative fixed charge; a plurality of first front electrodes extending in a first direction and connected to the emitter region through the front negative fixed charge layer and the front positive fixed charge layer; a plurality of second front electrodes extending in a second direction crossing the first direction and electrically and physically connected to the plurality of first front electrodes; a back aluminum oxide layer and a back silicon nitride layer on a back surface of the substrate; a plurality of back surface field regions extending in the first direction and locally positioned on the back surface of the substrate; a plurality of first back electrodes extending in the first direction and directly positioned on the plurality of back surface field regions through the back aluminum oxide layer and the back silicon nitride layer; and a plurality of second back electrodes extending in (Continued)

the second direction and electrically and physically connected to the plurality of first back electrodes, wherein the front negative fixed charge layer and the back aluminum oxide layer have the same thickness.

17 Claims, 4 Drawing Sheets

(51) Int. Cl.
*H01L 31/068* (2012.01)
*H01L 31/0236* (2006.01)

(56) References Cited

U.S. PATENT DOCUMENTS

| | | |
|---|---|---|
| 2009/0078305 A1 | 3/2009 | Nishiwaki |
| 2009/0101190 A1 | 4/2009 | Salami et al. |
| 2010/0263725 A1 | 10/2010 | Schmidt |
| 2011/0139243 A1 | 6/2011 | Shim et al. |
| 2011/0140226 A1* | 6/2011 | Jin .................... H01L 31/02363 257/460 |
| 2011/0168226 A1 | 7/2011 | Kim et al. |
| 2011/0197964 A1 | 8/2011 | Jang et al. |
| 2011/0265870 A1 | 11/2011 | Park et al. |
| 2011/0303266 A1 | 12/2011 | Chang et al. |

FOREIGN PATENT DOCUMENTS

| | | | |
|---|---|---|---|
| DE | 3815512 | A1 | 11/1989 |
| DE | 4217428 | A1 | 6/1993 |
| EP | 1763086 | A1 | 3/2007 |
| KR | 10-2008-0003840 | A | 1/2008 |
| KR | 10-2010-0130931 | A | 12/2010 |
| KR | 10-2011-0120582 | A | 11/2011 |
| KR | 10-2011-0124532 | A | 11/2011 |

* cited by examiner

SOLAR CELL

CROSS-REFERENCE TO RELATED APPLICATIONS

This Application is a Continuation of U.S. patent application Ser. No. 13/614,445 filed on Sep. 13, 2012, which claims priority to and the benefit of Korean Patent Application No. 10-2012-0014116 filed in the Korean Intellectual Property Office on Feb. 13, 2012, the entire contents of all of these applications are incorporated herein by reference into the present application.

BACKGROUND OF THE INVENTION

Field of the Invention

Embodiments of the invention relate to a solar cell.

Description of the Related Art

Solar power generation to convert light energy into electric energy using a photoelectric conversion effect has been widely used as a method for obtaining eco-friendly energy. A solar power generation system using a plurality of solar cell modules has been installed in places, such as houses, due to an improvement of a photoelectric conversion efficiency of solar cells.

A solar cell generally includes a substrate and an emitter region forming a p-n junction along with the substrate. The solar cell generates an electric current using light incident through one surface of the substrate.

An anti-reflection layer is formed on a light receiving surface of the substrate, so as to reduce a reflectance of light incident on the substrate and increase a transmittance of light of a predetermined wavelength band. Hence, the anti-reflection layer increases a photoelectric conversion efficiency of the solar cell.

Because light is generally incident only on one surface of the substrate of the solar cell, a current conversion efficiency of the solar cell is low.

Accordingly, a bifacial solar cell, in which light is incident on both surfaces of the substrate, has been recently developed.

SUMMARY OF THE INVENTION

In one aspect, there is a solar cell including a substrate of a first conductive type, a plurality of first electrodes which are positioned on one surface of the substrate and extending in a first direction, an emitter region which is electrically connected to the plurality of first electrodes and is of a second conductive type opposite the first conductive type, a plurality of second electrodes which are positioned on another surface of the substrate and extending in the first direction, and a back surface field region including a plurality of first field regions which are locally formed at locations corresponding to the plurality of second electrodes in the same direction as the plurality of second electrodes and are electrically connected to the plurality of second electrodes, wherein a distance between adjacent first field regions in a second direction perpendicular to the first direction is less than a distance between adjacent second electrodes in the second direction.

The distance between the adjacent second electrodes may be less than the distance between the adjacent first electrodes within a range of about 1.0 mm to 2.5 mm. A surface concentration of the back surface field region may be about $1E19/cm^2$ to $5E20/cm^2$. A junction depth of the back surface field region may be about 0.3 μm to 1.8 μm.

One first field region may include a first region which directly contacts one second electrode and overlaps the one second electrode, and a second region which is positioned around the first region in the second direction and does not overlap the one second electrode. A line width of the one first field region may be about two times to 4.5 times a line width of the one second electrode.

The line width of the one second electrode may be about 50 μm to 150 μm, and the line width of the one first field region may be about 100 μm to 600 μm.

The one second region may be positioned on one side or both sides of the one first region in the second direction. Line widths of the plurality of second regions respectively positioned on both sides of the one first region may be equal to or different from each other.

The solar cell may further include at least one second current collector which is electrically connected to the plurality of second electrodes and extending in the second direction.

In this instance, a portion of the one first field region may overlap a portion of the at least one second current collector.

On the other hand, the back surface field region may further include a second field region including a third region which directly contacts the second current collector and overlaps the second current collector, and a fourth region which is positioned around the third region and does not overlap the second current collector. A line width of the second field region may be greater than a line width of the second current collector, and be equal to or less than about 1.5 times the line width of the second current collector.

A line width of the second field region may be about 1.6 mm to 2.0 mm.

The fourth region may be positioned on one side or both sides of the third region in the first direction. Line widths of the fourth regions respectively positioned on both sides of the third region may be equal to or different from each other.

The solar cell may further include a first passivation layer positioned on a front surface of the emitter region, on which the plurality of first electrodes are not positioned, and a second passivation layer positioned on a back surface of the substrate, on which the plurality of second electrodes are not positioned. The first passivation layer and the second passivation layer may be formed of a material having fixed charges of the first conductive type.

The first passivation layer and the second passivation layer may each contain aluminum oxide ($AlO_x$) or yttrium oxide ($Y_2O_3$) having negative fixed charges. The first passivation layer and the second passivation layer may each have a refractive index of about 1.55 to 1.7 and a thickness of about 5 nm to 30 nm.

The solar cell may further include a first anti-reflection layer positioned on the first passivation layer and a second anti-reflection layer positioned on a back surface of the second passivation layer. The first anti-reflection layer and the second anti-reflection layer may be formed of silicon nitride ($SiN_x$) having positive fixed charges.

The first anti-reflection layer and the second anti-reflection layer may each have a refractive index of about 1.9 to 2.3 and a thickness of about 50 nm to 100 nm.

The substrate may be formed of an n-type silicon wafer doped with phosphorus (P). The emitter region may include a first doped region which is lightly doped with impurities of the second conductive type, and a second doped region which is more heavily doped than the first doped region with impurities of the second conductive type.

The passivation layer reduces a recombination rate of carriers. The performance of the passivation layer is improved as an impurity doping concentration at and around the surface of the substrate is reduced.

In the embodiment of the invention, because the back surface field region is formed only at the back surface of the substrate, on which the second electrodes and the second current collector are formed, a performance of the passivation layer is improved. Thus, the recombination rate of carriers is efficiently reduced, and a current density and an open voltage of the solar cell increase. As a result, the efficiency of the solar cell is improved.

The back surface field region has the same stripe shape as the second electrode formed on the back surface of the substrate or a grid shape corresponding to the second electrodes and the second current collector and is locally formed at the back surface of the substrate. Therefore, a transfer efficiency of carriers through the back surface field region is improved, and a separate edge isolation process is not necessary because impurities are not doped at an edge of the substrate.

Because the distance between the second electrodes is less than the distance between the first electrodes, an increase in a serial resistance resulting from an increase in a sheet resistance of the back surface of the substrate may be prevented or reduced.

Because the line width of the first field region is greater than the line width of the second electrode, the distance between the first field regions is less than the distance between the second electrodes. Hence, a process margin may be easily secured when the back surface field region is formed.

Aluminum oxide ($AlO_x$) or yttrium oxide ($Y_2O_3$) for forming the first and second passivation layers has excellent chemical passivation characteristic resulting from a low interface trap density and excellent field effect passivation characteristic resulting from the negative fixed charges. Further, the material is very excellent in stability, moisture transmission, and abrasion resistance.

Thus, the first and second passivation layers may reduce the recombination rate of carriers at the surface of the substrate, thereby improving the efficiency and the reliability of the solar cell.

Because the back surface field region is locally positioned only at the same location as the second electrodes, an influence of the second passivation layer formed of aluminum oxide ($AlO_x$) or yttrium oxide ($Y_2O_3$) on carriers moving to the back surface field region may be minimized.

In the embodiment of the invention, the second doped region of the emitter region is formed only at the same location as the first electrodes, and the first doped region having an impurity concentration lower than the second doped region is formed in a remaining region of the emitter region. Therefore, the emitter region including both the heavily doped region and the lightly doped region may further reduce the recombination rate of carriers than an emitter region including only a heavily doped region. Hence, a low serial resistance of the solar cell may be secured.

Both a front surface of the substrate, on which the first electrodes are positioned, and the back surface of the substrate, on which the second electrodes are positioned, are the textured surfaces, the first passivation layer and the first anti-reflection layer are formed on the front surface of the substrate, and the second passivation layer and the second anti-reflection layer are formed on the back surface of the substrate. Therefore, light, which is incident on the front surface of the substrate and then passes through the substrate, is again incident on the back surface of the substrate. As a result, the light may be used to generate electric current.

Thus, the efficiency of the solar cell according to the embodiment of the invention may further increase than a solar cell generating electric current using only light incident on the front surface of the substrate.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
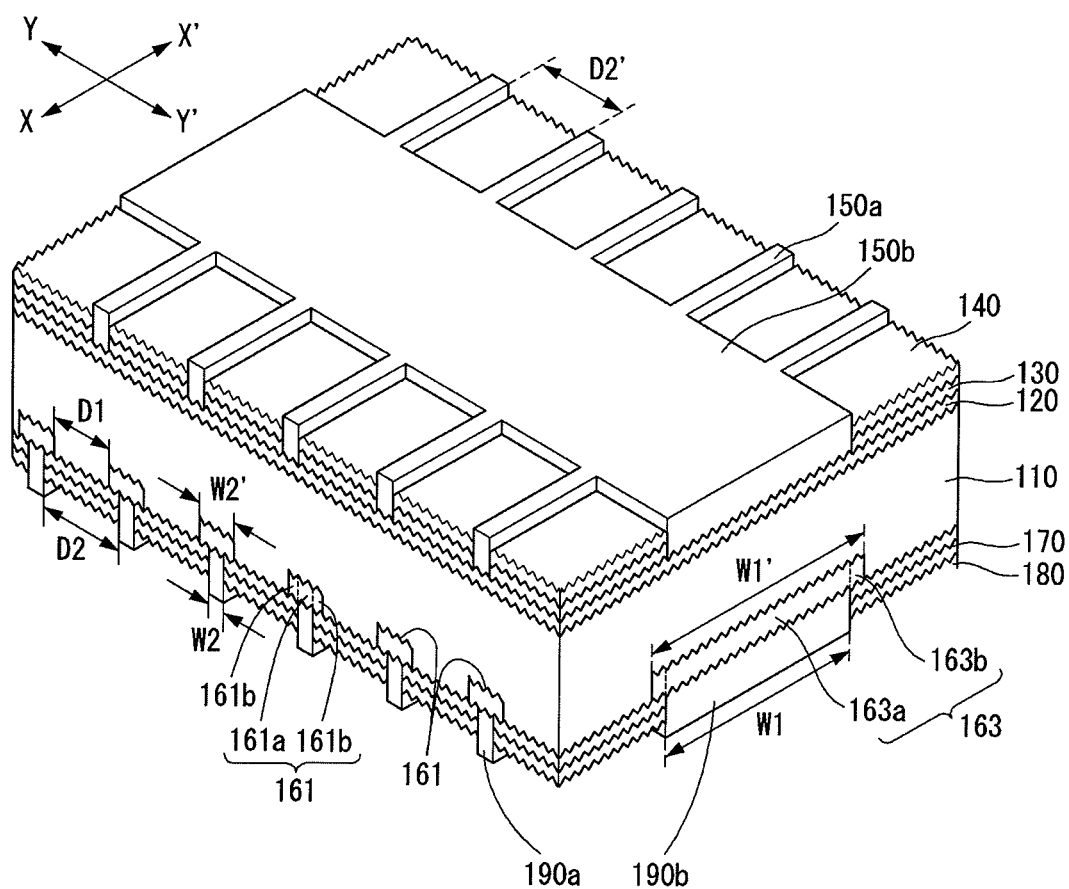
FIG. 1 is a schematic perspective view of a solar cell according to a first embodiment of the invention.

Embodiments of the invention will be described more fully hereinafter with reference to the accompanying drawings, in which example embodiments of the invention are shown. This invention may, however, be embodied in many different forms and should not be construed as limited to the embodiments set forth herein. In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present.

In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Example embodiments of the invention will be described in detail with reference to FIGS. 1 to 4.

Figure 2:
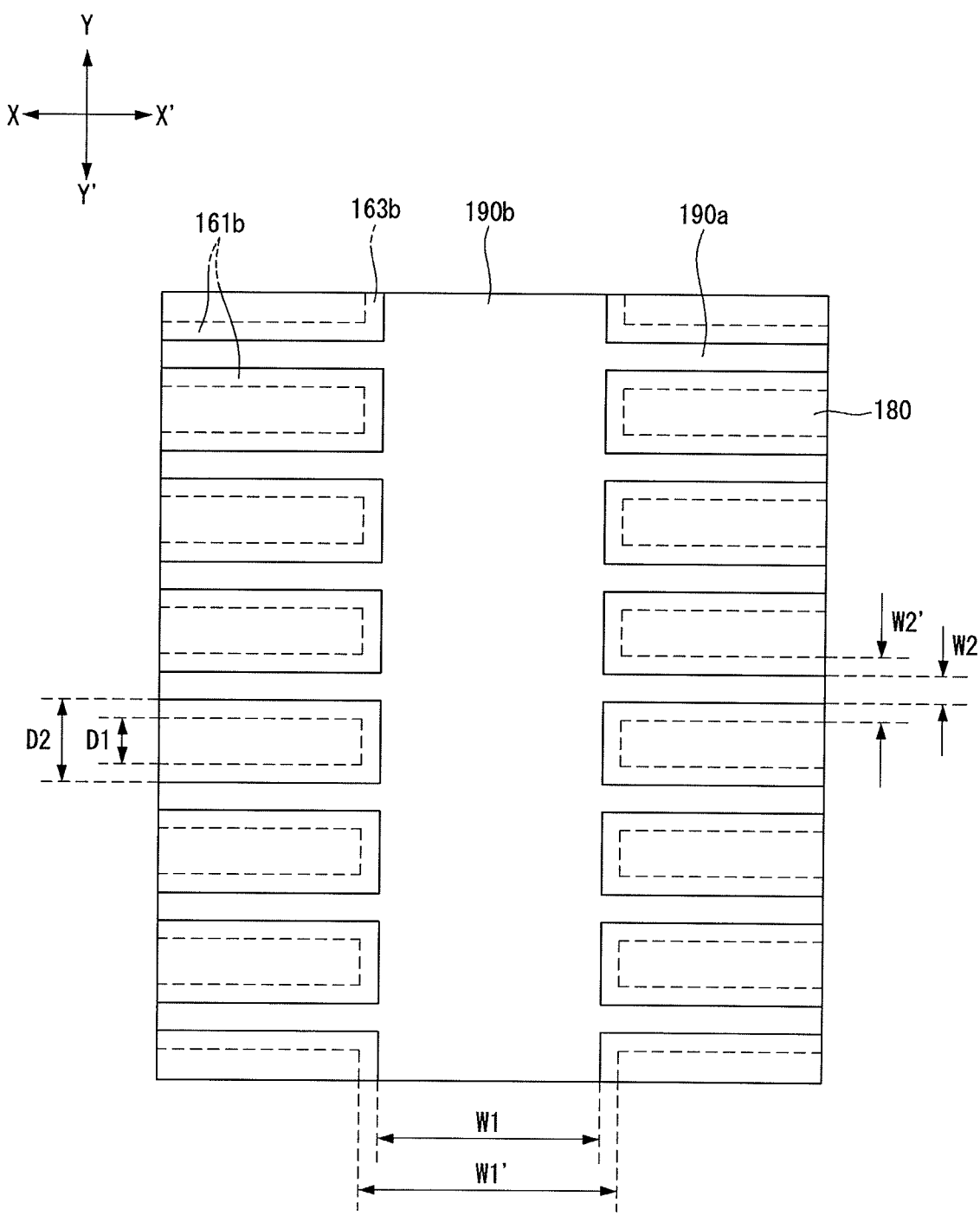
FIG. 2 is a plane view showing a back surface of the solar cell shown in FIG. 1.

FIG. 1 is a schematic perspective view of a solar cell according to a first embodiment of the invention. FIG. 2 is a plane view showing a back surface of the solar cell shown in FIG. 1.

As shown in FIG. 1, the solar cell according to the first embodiment of the invention includes a substrate 110, an emitter region 120 positioned at one surface of the substrate 110, for example, a front surface of the substrate 110, a first passivation layer 130 positioned on the emitter region 120, a first anti-reflection layer 140 positioned on the first passivation layer 130, a plurality of first electrodes 150a and a first current collector 150b positioned on the emitter region 120 on which the first passivation layer 130 and the first anti-reflection layer 140 are not positioned, a back surface field (BSF) region (shown as elements 161 and 163) positioned at a back surface of the substrate 110, a second passivation layer 170 positioned on the back surface of the substrate 110, a second anti-reflection layer 180 positioned on a back surface of the second passivation layer 170, and a plurality of second electrodes 190a and a second current collector 190b positioned on a back surface of the back surface field region on which the second passivation layer 170 and the second anti-reflection layer 180 are not positioned.

The substrate 110 may be formed of a silicon wafer of a first conductive type, for example, n-type, though not required. Silicon used in the substrate 110 may be single crystal silicon, polycrystalline silicon, or amorphous silicon.

When the substrate 110 is of the n-type, the substrate 110 may contain impurities of a group V element such as phosphorus (P), arsenic (As), and antimony (Sb). The substrate 110 may have resistivity of about 1 $\Omega \cdot cm^2$ to 10 $\Omega \cdot cm^2$.

The surface of the substrate 110 may be uniformly textured to form a textured surface corresponding to an uneven surface or having uneven characteristics. More specifically, the substrate 110 has a first textured surface corresponding to the front surface, at which the emitter region 120 is positioned, and a second textured surface corresponding to the back surface opposite the front surface.

The emitter region 120 positioned at the front surface of the substrate 110 is an impurity region of a second conductive type (for example, p-type) opposite the first conductive type (for example, n-type) of the substrate 110. Thus, the emitter region 120 forms a p-n junction along with the substrate 110.

Carriers, i.e., electron-hole pairs produced by light incident on the substrate 110 are separated into electrons and holes by a built-in potential difference resulting from the p-n junction between the substrate 110 and the emitter region 120. Then, the separated electrons move to the n-type semiconductor, and the separated holes move to the p-type semiconductor.

Thus, when the substrate 110 is of the n-type and the emitter region 120 is of the p-type, the separated electrons move to the substrate 110 and the separated holes move to the emitter region 120.

When the emitter region 120 is of the p-type, the emitter region 120 may be formed by doping impurities of a group III element such as boron (B), gallium (Ga), and indium (In) on the substrate 110.

The first passivation layer 130 positioned on the emitter region 120 formed at the front surface of the substrate 110 is formed of a material having negative fixed charges, for example, aluminum oxide ($AlO_x$) or yttrium oxide ($Y_2O_3$).

The material of the first passivation layer 130 such as $AlO_x$ or $Y_2O_3$ has excellent chemical passivation characteristic resulting from a low interface trap density and excellent field effect passivation characteristic resulting from the negative fixed charges. Further, the material is very excellent in stability, moisture transmission, and abrasion resistance.

Thus, the first passivation layer 130 reduces a recombination velocity of carries at the surface of the substrate 110, thereby improving the efficiency and the reliability of the solar cell.

The first anti-reflection layer 140 positioned on the first passivation layer 130 is formed of a material having positive fixed charges, for example, silicon nitride ($SiN_x$).

The first anti-reflection layer 140 reduces a reflectance of light incident on the solar cell through the front surface of the substrate 110 and increases selectivity of a predetermined wavelength band, thereby increasing the efficiency of the solar cell.

The first passivation layer 130 has a refractive index of about 1.55 to 1.7 and a thickness of about 5 nm to 30 nm, so as to minimize the light reflectance at the front surface of the substrate 110. The first anti-reflection layer 140 has a refractive index of about 1.9 to 2.3 and a thickness of about 50 nm to 100 nm.

The light reflectance at the front surface of the substrate 110 represented a minimum value when the first passivation layer 130 and the first anti-reflection layer 140 were within the above refractive index and thickness ranges.

A silicon oxide layer having a thickness of about 1 nm to 3 nm may be further formed at an interface between the first passivation layer 130 and the emitter region 120.

The plurality of first electrodes 150a are positioned on the emitter region 120 of the front surface of the substrate 110 and are electrically and physically connected to the emitter region 120. The first electrodes 150a elongate (or extend) along a first direction X-X' shown in FIG. 1 and extend substantially parallel to one another at a uniform distance therebetween.

The first electrodes 150a collect carriers (for example, holes) moving to the emitter region 120.

The first electrodes 150a may be formed of at least one conductive material selected from the group consisting of nickel (Ni), copper (Cu), tin (Sn), zinc (Zn), indium (In), titanium (Ti), gold (Au), and a combination thereof. Other conductive materials may be used.

The first electrodes 150a may be formed by printing and firing a conductive paste containing the conductive material using a screen printing method or performing a plating process using a seed layer.

The first current collector 150b is positioned on the emitter region 120 of the front surface of the substrate 110 and is electrically and physically connected to the emitter region 120 in the same manner as the first electrodes 150a. The first current collector 150b is electrically and physically connected to the first electrodes 150a. The first current collector 150b elongates (or extends) along a second direction Y-Y' perpendicular to the first direction X-X'.

The first current collector 150b may be formed using the same material and method as the first electrodes 150a.

The back surface field region is locally formed at the back surface of the substrate 110. In the embodiment of the invention, the fact that the back surface field region is locally formed is that the back surface field region is not formed at the entire back surface of the substrate 110 and is formed in a portion of the back surface of the substrate 110, for example, only at a location corresponding to the second electrodes 190a and the second current collector 190b.

The back surface field region is a region (for example, an $n^+$-type region) that is more heavily doped than the substrate 110 with impurities of the same conductive type as the substrate 110.

A potential barrier is formed by a difference between impurity concentrations of the substrate 110 and the back surface field region, and thus prevents or reduces the movement of carriers to the back surface of the substrate 110. Hence, the back surface field region prevents or reduces a recombination and/or a disappearance of electrons and holes at and around the back surface of the substrate 110. The back surface field region includes a plurality of first field regions 161, each of which is formed at a location corresponding to each second electrode 190a, and a second field region 163 formed at a location corresponding to the second current collector 190b.

A dose concentration of ions used to form the back surface field region is set to a concentration capable of securing contact resistance characteristics at the back surface of the substrate 110, preferably, about 3.5E20/cm² to 5.5 E20/cm².

When ions are injected at the above noted dose concentration in the back surface field region, a concentration of the ions in the back surface of the substrate 110 after a thermal process may be about 1E19/cm² to 5E20/cm². A junction depth of the back surface field region may be about 0.3 µm to 1.8 µm. In the embodiment of the invention, the junction depth indicates a thickness of the back surface field region. In embodiments of the invention, the junction depth of the back surface field region may vary according to a texturing of the back surface of the substrate 110. Also, the concentration of the ions in the back surface (or the back surface field region) of the substrate 110 may be referred to as a surface concentration.

A first region 161a and a second region 161b constituting the first field region 161 underlie the second electrode 190a. A third region 163a and a fourth region 163b constituting the second field region 163 underlie the second current collector 190b.

The first region 161a of the first field region 161 is a region which directly contacts the second electrode 190a elongating (or extending) in the first direction X-X' and overlaps the second electrode 190a. The third region 163a of the second field region 163 is a region which directly contacts the second current collector 190b elongating (or extending) in the second direction Y-Y' and overlaps the second current collector 190b.

The second region 161b of the first field region 161 is a region which is positioned around the first region 161a in the second direction Y-Y' and does not overlap the second electrode 190a. The fourth region 163b of the second field region 163 is a region which is positioned around the third region 163a in the first direction X-X' and does not overlap the second current collector 190b. The second region 161b contacts the fourth region 163b.

Accordingly, the second electrode 190a is positioned on the first region 161a of the first field region 161 and directly contacts the first region 161a. The second current collector 190b is positioned on the third region 163a of the second field region 163 and directly contacts the third region 163a.

The second electrodes 190a and the second current collector 190b may be formed of at least one conductive material selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used.

The second electrodes 190a and the second current collector 190b collect carriers moving to the substrate 110 and output the carriers to the outside.

A line width W1 of the second current collector 190b is greater than a line width W2 of the second electrode 190a, so as to improve collection efficiency of carriers. The line width W1 of the second current collector 190b may be about 1,000 µm to 3,000 µm, preferably, 1,500 µm. The line width W2 of the second electrode 190a may be about 50 µm to 150 µm.

A line width W2' of the first field region 161 including the first region 161a and the second region 161b may be about two times to 4.5 times the line width W2 of the second electrode 190a. For example, when the line width W2 of the second electrode 190a is about 50 µm to 150 µm, and the line width W2' of the first field region 161 may be about 100 µm to 600 µm.

As shown in FIG. 1, the second regions 161b may be respectively formed at both sides (or opposite sides) of the first region 161a in the second direction Y-Y' and may have the same line width. Alternatively, the second regions 161b respectively formed at both sides (or opposite sides) of the first region 161a may have different line widths. Alternatively, the second region 161b may be formed only at one side of the first region 161a in the second direction Y-Y'.

As described above, because the first field region 161 has the second region 161b not overlapping the second electrode 190a, a distance D1 between the adjacent first field regions 161 in the second direction Y-Y' is less than a distance D2 between the adjacent second electrodes 190a in the second direction Y-Y'.

Accordingly, a process margin may be sufficiently secured when the first field regions 161 and the second electrodes 190a are formed. Further, a problem resulting from the misalignment of the first field regions 161 and the second electrodes 190a may be reduced or removed.

When the back surface field region is locally formed at the back surface of the substrate 110, a serial resistance increases in a non-formation area of the back surface field region in the back surface of the substrate 110. Thus, in the embodiment of the invention, the distance D2 between the adjacent second electrodes 190a is less than a distance D2' between the adjacent first electrodes 150a, so as to prevent or reduce an increase in the serial resistance in the back surface of the substrate 110. The distance D2' between the adjacent first electrodes 150a may be equal to or greater than about 2.5 mm, and the distance D2 between the adjacent second electrodes 190a may be equal to or greater than about 1.0 mm and less than about 2.5 mm.

Because the line width W1 of the second current collector 190b is greater than the line width W2 of the second electrode 190a, a line width W1' of the second field region 163 formed in a formation area of the second current collector 190b is greater than the line width W2' of the first field region 161.

Accordingly, the second field region 163 formed at the location corresponding to the second current collector 190b has a process margin less than the first field region 161 formed in a formation area of the second electrode 190a, but may easily remove the problem resulting from the misalignment.

Because of these reasons, the line width W1' of the second field region 163 including the third region 163a and the fourth region 163b may be greater than the line width W1 of the second current collector 190b, and equal to or less than about 1.5 times the line width W1 of the second current collector 190b.

For example, when the line width W1 of the second current collector 190b is about 1.5 mm, the line width W1' of the second field region 163 may be about 1.6 mm to 2.0 mm.

The fourth regions 163b may be respectively formed at both sides (or opposite sides) of the third region 163a in the first direction X-X' and may have the same line width. Alternatively, the fourth regions 163b respectively formed at both sides (or opposite sides) of the third region 163a may have different line widths. Alternatively, the fourth region 163b may be formed only at one side of the third region 163a in the first direction X-X'.

The back surface field region including the first field regions 161 and the second field region 163 may be locally formed at the back surface of the substrate 110 through an ion implantation process using a mask.

When the back surface field region is formed through the ion implantation process, the back surface field region is not formed at an edge of the substrate 110. Thus, a separate process for the edge isolation is not necessary.

Because the performance of the passivation layer is improved in the non-formation area of the back surface field region, a recombination rate of carriers is reduced. Thus, a current density and an open voltage of the solar cell increase, and the efficiency of the solar cell is improved.

The second passivation layer 170 and the second anti-reflection layer 180 are positioned on the back surface of the substrate 110, on which the second electrodes 190a and the second current collector 190b are not positioned.

In the embodiment of the invention, the second passivation layer 170 is formed of the same material as the first passivation layer 130 and has the same thickness as the first passivation layer 130. Further, the second anti-reflection layer 180 is formed of the same material as the first anti-reflection layer 140 and has the same thickness as the first anti-reflection layer 140.

Because the second passivation layer 170 positioned on the back surface of the substrate 110 is formed of a material having negative fixed charges, for example, aluminum oxide ($AlO_x$) or yttrium oxide ($Y_2O_3$), carriers moving to the back surface of the substrate 110 is affected by the second passivation layer 170.

However, in the embodiment of the invention, because the back surface field region is locally positioned only at the same location as the second electrodes 190a and the second current collector 190b, an influence of the second passivation layer 170 formed of aluminum oxide ($AlO_x$) or yttrium oxide ($Y_2O_3$) on carriers moving to the back surface field region may be minimized.

The solar cell having the above-described structure according to the embodiment of the invention may be used as a bifacial solar cell, and an operation of the solar cell is described below.

When light irradiated onto the solar cell is incident on the substrate 110 through the emitter region 120 and/or the back surface of the substrate 110, a plurality of electron-hole pairs are generated in the substrate 110 by light energy produced by the light incident on the substrate 110.

Because the front surface and the back surface of the substrate 110 are the textured surface, light reflectance in the front surface and the back surface of the substrate 110 is reduced. Further, because both a light incident operation and a light reflection operation are performed on the textured surfaces of the substrate 110, light is confined in the solar cell. Hence, a light absorptance and efficiency of the solar cell are improved.

In addition, a reflection loss of light incident on the substrate 110 is reduced by the first passivation layer 130 and the first anti-reflection layer 140 positioned on the front surface of the substrate 110 and the second passivation layer 170 and the second anti-reflection layer 180 positioned on the back surface of the substrate 110. Thus, an amount of light incident on the substrate 110 further increases.

The electron-hole pairs are separated into electrons and holes by the p-n junction between the substrate 110 and the emitter region 120. Then, the separated electrons move to the n-type substrate 110, and the separated holes move to the p-type emitter region 120. As described above, the electrons moving to the substrate 110 move to the second electrodes 190a and the second current collector 190b through the first field regions 161 and the second field region 163 of the back surface field region, and the holes moving to the emitter region 120 move to the first electrodes 150a and the first current collector 150b.

Accordingly, when the first current collector 150b of one solar cell is connected to the second current collector 190b of another solar cell adjacent to the one solar cell using electric wires, for example, an interconnector, electric current flows therein to thereby enable use of the current for electric power.

The solar cell having the above-described configuration may be used in a state where the solar cell is positioned between a light transmission front substrate and a light transmission back substrate and is sealed by a protective layer.

A solar cell according to a second embodiment of the invention is described below with reference to FIGS. 3 and 4.

Since configuration of the solar cell according to the second embodiment of the invention is substantially the same as the solar cell according to the first embodiment of the invention except an emitter region and a back surface field region, a further description may be briefly made or may be entirely omitted.

The emitter region 120 of the solar cell according to the first embodiment of the invention substantially has a uniform doping concentration throughout the entire front surface of the substrate 110. Thus, the emitter region 120 according to the first embodiment of the invention may be easily manufactured through a simple process, but a recombination rate of carriers may increase because of the high doping concentration of the emitter region 120. As a result, an improvement in the efficiency of the solar cell may be limited.

Accordingly, the solar cell according to the second embodiment of the invention includes a selective emitter region 220 including a heavily doped region formed at a location corresponding to first electrodes 150a and a first current collector 150b, and a lightly doped region excluding the heavily doped region from the selective emitter region 220, so as to reduce the recombination rate of carriers.

In other words, the selective emitter region 220 according to the second embodiment of the invention includes a first doped region 221 which is lightly doped with p-type impurities, and a second doped region 222, which is more heavily doped than the first doped region 221 with p-type impurities.

As described above, because the first and second doped regions 221 and 222 of the selective emitter region 220 have different impurity doping concentrations, an impurity doping thickness of the second doped region 222 is greater than an impurity doping thickness of the first doped region 221. Thus, a thickness of the second doped region 222 is greater than a thickness of the first doped region 221, and bottom surfaces of the first and second doped regions 221 and 222 are positioned on the same plane (or are coplanar). The selective emitter region 220 having the above-described structure may be formed using an etch back process.

Because the impurity doping thickness of the second doped region 222 is greater than the impurity doping thickness of the first doped region 221, a sheet resistance of the second doped region 222 is less than a sheet resistance of the first doped region 221.

For example, the sheet resistance of the first doped region 221 may be about 80 Ω/sq to 200 Ω/sq, and the sheet resistance of the second doped region 222 may be about 30 Ω/sq to 80 Ω/sq.

The second doped region 222 may be formed at the front surface of the substrate 110, on which the first electrodes 150a and the first current collector 150b are positioned.

A line width of the second doped region 222 formed at the front surface of the substrate 110, on which the first electrode 150a is positioned, may be greater than a line width of the first electrode 150a, because of the same reason why the line width W2' of the first field region 161 is greater than the line width W2 of the second electrode 190a in the first embodiment of the invention illustrated in FIGS. 1 and 2.

Further, a line width of the second doped region 222 formed at the front surface of the substrate 110, on which the first current collector 150b is positioned, may be greater than a line width of the first current collector 150b, because of the same reason why the line width W1' of the second field region 163 is greater than the line width W1 of the second current collector 190b in the first embodiment of the invention illustrated in FIGS. 1 and 2.

The solar cell having the above-described selective emitter structure reduces the recombination rate of carriers and thus may improve the efficiency.

In the second embodiment of the invention, the back surface field region formed at the back surface of the substrate 110 includes only a plurality of first field regions 161 unlike the first embodiment of the invention. Namely, a second field region is not formed at a location corresponding to the second current collector 190b.

Each of the first field regions 161 elongates (or extends) in the first direction X-X' and thus crosses the second current collector 190b elongating (or extending) in the second direction Y-Y'. Thus, a portion of the first field region 161 overlaps a portion of the second current collector 190b.

Alternatively, the first field regions 161 may not be formed in a formation area of the second current collector 190b.

Figure 3:
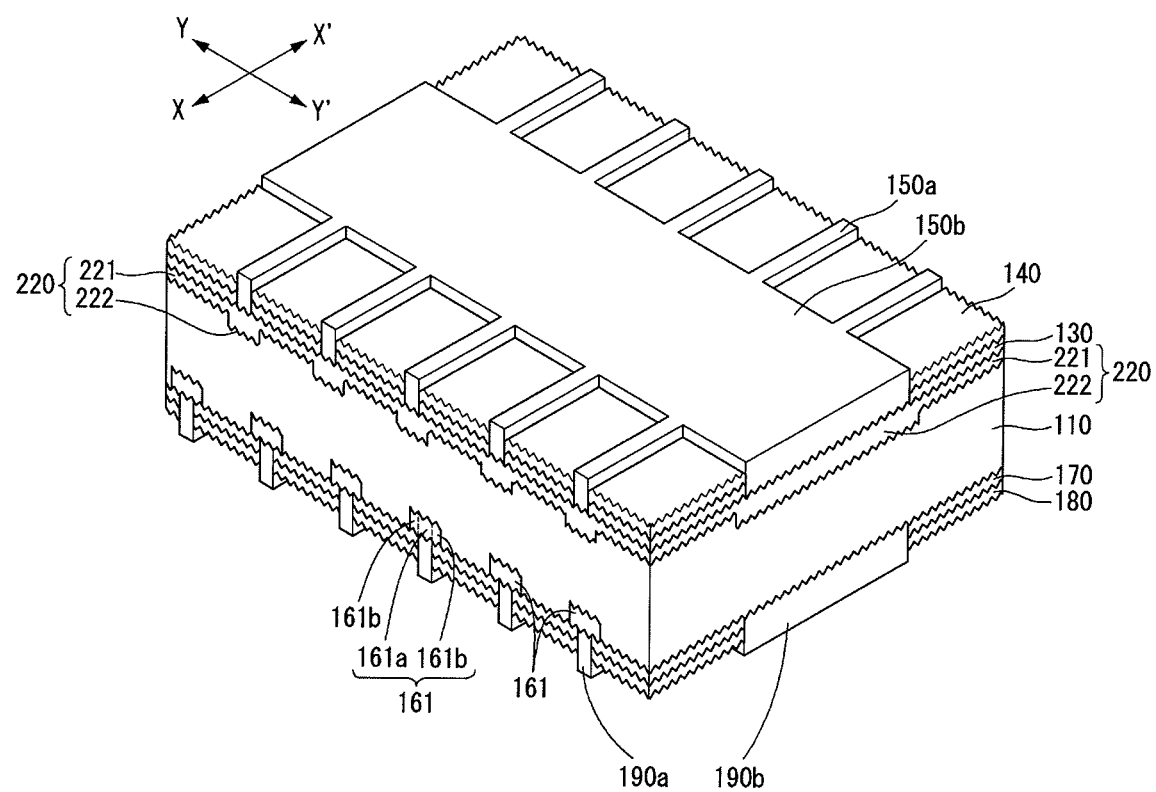
FIG. 3 is a schematic perspective view of a solar cell according to a second embodiment of the invention.
Figure 4:
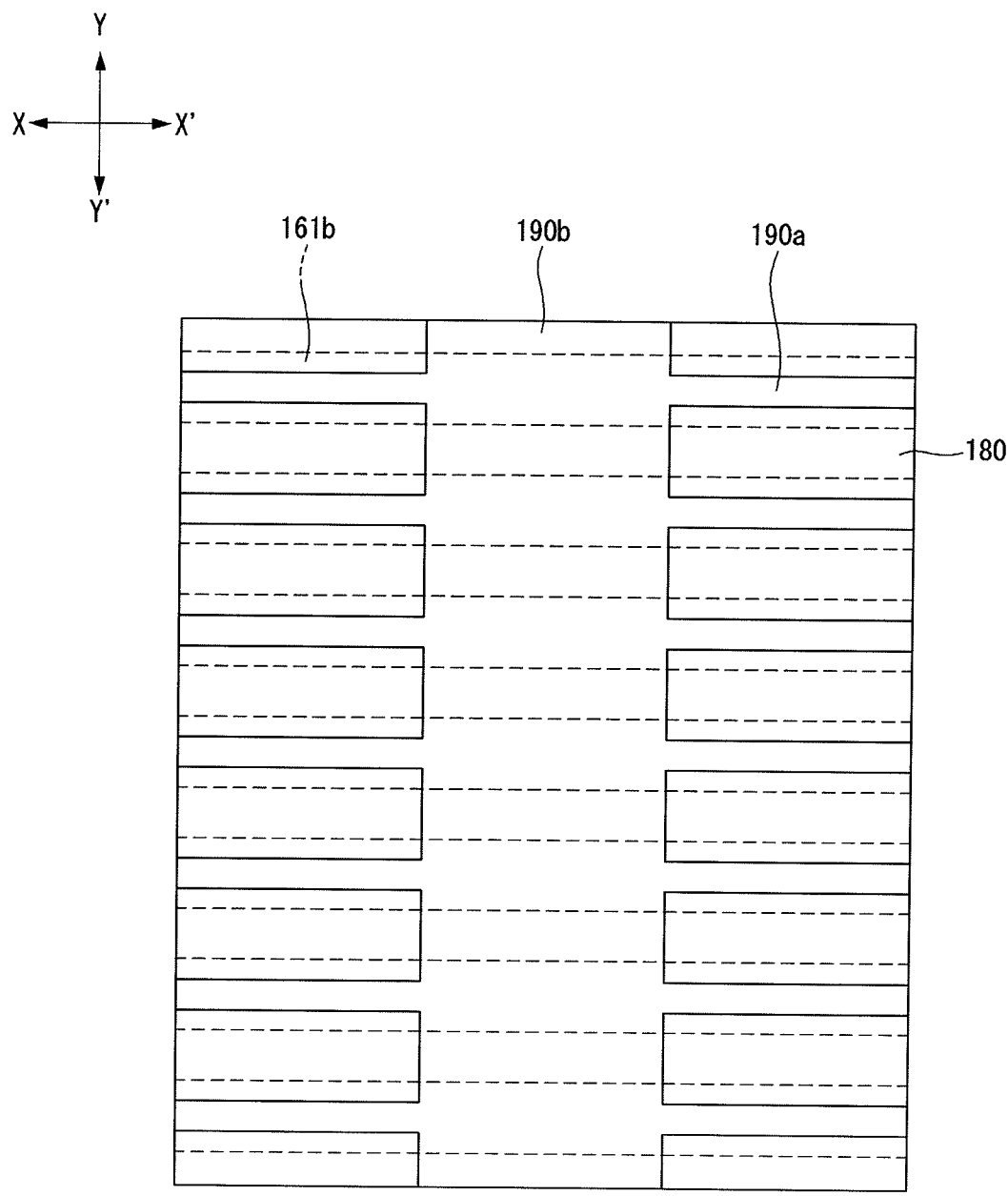
FIG. 4 is a plane view showing a back surface of the solar cell shown in FIG. 3.

The structure of the emitter region according to the first embodiment of the invention illustrated in FIGS. 1 and 2 and the structure of the back surface field region according to the second embodiment of the invention illustrated in FIGS. 3 and 4 may be used together. Further, the structure of the back surface field region according to the first embodiment of the invention illustrated in FIGS. 1 and 2 and the structure of the emitter region according to the second embodiment of the invention illustrated in FIGS. 3 and 4 may be used together.

In the embodiments of the invention, all of the first electrodes 150a, the first current collector 150b, the second electrodes 190a, and the second current collector 190b have a stripe shape. Other shapes may be used for them in other embodiments of the invention.

For example, the first electrodes 150a and the second electrodes 190a may have a zigzag shape which has a certain width and is bent in the second direction Y-Y'. Alternatively, the first current collector 150b and the second current collector 190b may have a zigzag shape which has a certain width and is bent in the first direction X-X'.

In embodiments of the invention, the first electrodes 150a may or may not be aligned with the second electrodes 190a. In embodiments of the invention, none or only some of the first electrodes 150a may be aligned with the second electrodes 190a. In other embodiments of the invention, all or most of the first electrodes 150a may be aligned with the second electrodes 190a.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A bifacial solar cell comprising:
   a substrate formed of a silicon wafer having an n-type conductivity;
   an emitter region positioned on a front surface of the substrate and having a p-type conductivity;
   a front negative fixed charge layer on the emitter region, and a front positive fixed charge layer on the front negative fixed charge layer;
   a plurality of first front electrodes extending in a first direction and connected to the emitter region through the front negative fixed charge layer and the front positive fixed charge layer;
   a plurality of second front electrodes extending in a second direction crossing the first direction and electrically and physically connected to the plurality of first front electrodes;
   a back aluminum oxide layer and a back silicon nitride layer on a back surface of the substrate;
   a plurality of back surface field regions extending in the first direction and locally positioned on the back surface of the substrate;
   a plurality of first back electrodes extending in the first direction and directly positioned on the plurality of back surface field regions through the back aluminum oxide layer and the back silicon nitride layer; and
   a plurality of second back electrodes extending in the second direction and electrically and physically connected to the plurality of first back electrodes,
   wherein the front negative fixed charge layer and the back aluminum oxide layer have the same thickness, and
   wherein in the back surface of the substrate positioned between two back surface field regions adjacent to each other in the second direction, a first length of the back surface of the substrate in the first direction is greater than a second length of the back surface of the substrate in the second direction.

2. The bifacial solar cell of claim 1, wherein a distance between adjacent first back electrodes is within a range of about 1.0 mm to 2.5 mm.

3. The bifacial solar cell of claim 1, wherein a surface concentration of each back surface field region of the plurality of back surface field regions is about $1E19/cm^3$ to $5E20/cm^3$.

4. The bifacial solar cell of claim 1, wherein a junction depth of each back surface field region of the plurality of back surface field regions is about 0.3 μm to 1.8 μm.

5. The bifacial solar cell of claim 1, wherein one back surface field region of the plurality of back surface field regions includes a first region which directly contacts one first back electrode of the plurality of first back electrodes and overlaps the one first back electrode, and a second region which is positioned around the first region in the second direction and does not overlap the one first back electrode, and
   wherein a line width of the one back surface field region is about two times to 4.5 times a line width of the one first back electrode.

6. The bifacial solar cell of claim 5, wherein the line width of the one first back electrode is about 50 μm to 150 μm, and the line width of the one back surface field region is about 100 μm to 600 μm.

7. The bifacial solar cell of claim 5, wherein the second region is positioned on one side or both sides of the first region in the second direction.

8. The bifacial solar cell of claim 1, wherein the front negative fixed charge layer and the back aluminum oxide layer have a refractive index of about 1.55 to 1.7 and the same thickness of about 5 nm to 30 nm.

9. The bifacial solar cell of claim 1, wherein the front positive fixed charge layer and the back silicon nitride layer have a refractive index of about 1.9 to 2.3 and a thickness of about 50 nm to 100 nm.

10. The bifacial solar cell of claim 1, wherein the front surface of the substrate is formed as a first textured surface, and
wherein the back surface of the substrate is formed as a second textured surface.

11. The bifacial solar cell of claim 1, wherein the silicon wafer of the substrate is doped with phosphorus (P).

12. The bifacial solar cell of claim 1, wherein the emitter region includes a first doped region which is lightly doped with impurities of the p-type conductivity, and a second doped region which is more heavily doped than the first doped region with impurities of the p-type conductivity.

13. The bifacial solar cell of claim 1, wherein the plurality of back surface field regions are more heavily doped than the substrate with impurities of the n-type conductivity.

14. The bifacial solar cell of claim 1, wherein the plurality of back surface field regions are separated from each other in the second direction.

15. The bifacial solar cell of claim 1, wherein the plurality of back surface field regions are separated from each other only in the second direction.

16. The bifacial solar cell of claim 1, wherein the first length of the back surface of the substrate extends from an edge of the substrate to an intersecting back surface field that contacts one of the plurality of second back electrode that is closest to the edge.

17. The bifacial solar cell of claim 5, wherein the second region includes a third region and a fourth region that extends in the second direction, the third region directly contacting one second back electrode of the plurality of second back electrodes and overlaps the one second back electrode, and the fourth region being positioned adjacent the third region and not overlapping the one second back electrode, and
wherein a line width of the second region in the first direction is greater than a line width of the one second back electrode in the first direction and equal to or less than about 1.5 time the line width of the one second back electrode in the first direction.

* * * * *